United States Patent
Deuel et al.

(10) Patent No.: US 12,368,401 B1
(45) Date of Patent: Jul. 22, 2025

(54) ELECTRIC LINEAR ACTUATOR WITH POSITION SENSING

(71) Applicant: Brunswick Corporation, Mettawa, IL (US)

(72) Inventors: Eric S. Deuel, Allendale, MI (US); Shawn W. Lubeno, Hobe Sound, FL (US)

(73) Assignee: Brunswick Corporation, Mettawa, IL (US)

( * ) Notice: Subject to any disclaimer, the term of this patent is extended or adjusted under 35 U.S.C. 154(b) by 338 days.

(21) Appl. No.: 17/716,542

(22) Filed: Apr. 8, 2022

(51) Int. Cl.
| | |
|---|---|
| *G05G 25/00* | (2006.01) |
| *F16H 25/20* | (2006.01) |
| *G01D 3/08* | (2006.01) |
| *H02P 23/12* | (2006.01) |
| *H02P 23/14* | (2006.01) |
| *H03H 17/02* | (2006.01) |

(52) U.S. Cl.
CPC ......... *H02P 23/14* (2013.01); *F16H 25/2015* (2013.01); *H02P 23/12* (2013.01); *H03H 17/0202* (2013.01); *F16H 2025/2081* (2013.01); *H03H 2017/0205* (2013.01)

(58) Field of Classification Search
CPC ...... H02P 23/14; H02P 23/12; F16H 25/2015; F16H 2025/2081; H03H 17/0202; H03H 2017/0205
USPC ........................................................ 318/663
See application file for complete search history.

(56) References Cited

U.S. PATENT DOCUMENTS

| | | | |
|---|---|---|---|
| 4,741,713 A | 5/1988 | Ohlsson et al. | |
| 4,828,229 A | 5/1989 | Fannin et al. | |
| 4,985,005 A | 1/1991 | Nestvall et al. | |
| 5,161,083 A | 11/1992 | Mohler et al. | |
| 5,742,161 A | 4/1998 | Karte | |
| 5,952,823 A | 9/1999 | Nyce et al. | |
| 6,828,780 B2 * | 12/2004 | Jagiella | G01D 5/2033 324/207.16 |

(Continued)

FOREIGN PATENT DOCUMENTS

| | | |
|---|---|---|
| DE | 102007029488 A1 | 1/2009 |
| WO | 2015003791 A1 | 1/2015 |

(Continued)

OTHER PUBLICATIONS

Peninsular Cylinder, Co., "Cylinder Position Sensing", https://www.peninsularcylinders.com/products/special-cylinders/cylinder-position-sensing, 9 pages, accessed Mar. 9, 2022.

(Continued)

*Primary Examiner* — Gabriel Agared
(74) *Attorney, Agent, or Firm* — Andrus Intellectual Property Law, LLP

(57) ABSTRACT

An electric linear actuator has a housing extending along a longitudinal axis. A spindle is provided in the housing and extends along the longitudinal axis. A rod is coaxially coupled to the spindle and extends from a proximal end located in the housing to a distal end located outside the housing. The rod is movable along the longitudinal axis in response to rotation of the spindle. A circuit board is located in the housing adjacent the proximal end of the rod. The circuit board includes a linear inductive sensor having a linear axis oriented parallel to the longitudinal axis. The linear inductive sensor senses an actual position of the proximal end of the rod.

15 Claims, 3 Drawing Sheets

(56) References Cited

U.S. PATENT DOCUMENTS

| | | | |
|---|---|---|---|
| 7,216,054 | B1 | 5/2007 | Pchelnikov et al. |
| 7,249,418 | B2 | 7/2007 | Bartscht et al. |
| 7,705,585 | B2 | 4/2010 | Howard |
| 8,020,453 | B2 | 9/2011 | Kreit et al. |
| 8,079,270 | B2 | 12/2011 | Gratz et al. |
| 8,098,061 | B2 | 1/2012 | Elliott et al. |
| 8,997,628 | B2 | 4/2015 | Sall et al. |
| 9,810,552 | B2 | 11/2017 | Hunter et al. |
| 10,571,304 | B2 | 2/2020 | Alexander et al. |
| 10,760,928 | B1 | 9/2020 | Shaga et al. |
| 11,168,999 | B2 | 11/2021 | DeShaies et al. |
| 11,215,973 | B2 | 1/2022 | Gray et al. |
| 2006/0016281 | A1 | 1/2006 | Donald et al. |
| 2009/0323737 | A1* | 12/2009 | Ensher .............. H01S 5/141 |
| | | | 372/102 |
| 2010/0127695 | A1 | 5/2010 | Harris |
| 2012/0001582 | A1* | 1/2012 | Park ................ G05B 13/048 |
| | | | 318/632 |
| 2019/0127049 | A1* | 5/2019 | Blanding ............. B64C 9/00 |
| 2019/0154439 | A1* | 5/2019 | Binder ................ G01S 15/08 |
| 2019/0234759 | A1* | 8/2019 | DeShaies ............ G01D 5/145 |
| 2019/0280674 | A1* | 9/2019 | Berkemeier ......... G05D 1/027 |
| 2020/0013281 | A1* | 1/2020 | Eriksson ............ G01S 5/0205 |
| 2020/0186019 | A1* | 6/2020 | Freiberger .......... H02K 11/20 |
| 2021/0040775 | A1 | 2/2021 | Kusanale et al. |

FOREIGN PATENT DOCUMENTS

| | | |
|---|---|---|
| WO | 2015121281 A1 | 8/2015 |
| WO | 2021026348 A1 | 2/2021 |

OTHER PUBLICATIONS

Guckel et al., "Electromagnetic Linear Actuators With Inductive Position Sensing For Micro Relay, Micro Valve And Precision Positioning Applications", Proceedings of the International Solid-State Sensors and Actuators Conferences, Transducers '95, Jun. 25-29, 1995, 4 pages.

Festo, "Linear Actuator DFPI", www.festo.com, 2 pages, accessed Mar. 1, 2022.

Microchip Technology, "Inductive Sensor Interface IC", LX3302A, https://www.microchip.com/en-us/product/LX3302A, 11 pages, accessed Mar. 10, 2022.

Microchip Technology, "LXK3302AL002—LX3302A 100mm Linear Inductive Position Sensor Evaluation Board With Programmer", https://www.microchip.com/en-us/development/tool/LXK3302AL002, accessed Mar. 8, 2022.

Alliance Sensors Group, "ME-7 Series LVIT Linear Position Sensor", 2021, 2 pages.

Microchip Technology, "Robust, Low-Cost and Noise-Immune Motion-Sensing Inductive Sensors", 2018, www.microchip.com/automotive, 2 pages.

\* cited by examiner

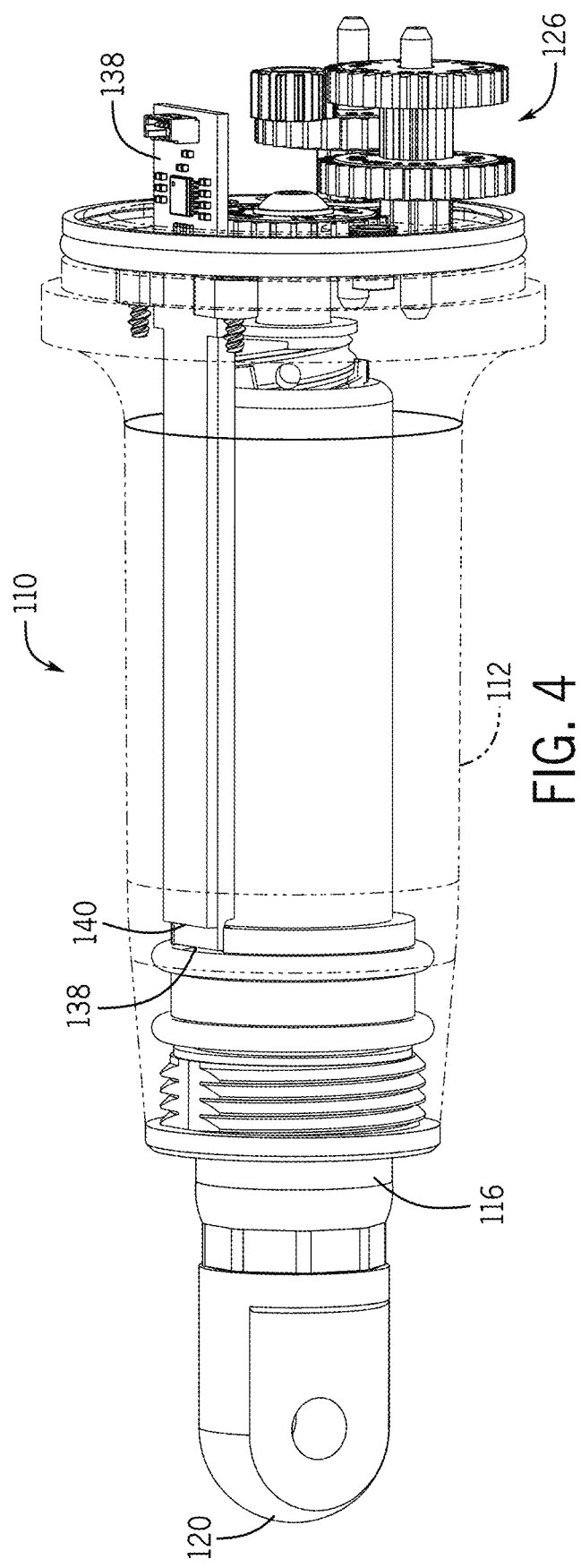

ELECTRIC LINEAR ACTUATOR WITH POSITION SENSING

FIELD

The present application relates to the field of electric linear actuators, and specifically to assemblies and methods for sensing extension of a rod of the actuator with respect to a housing thereof.

BACKGROUND

U.S. Pat. No. 10,760,928, which is hereby incorporated by reference herein, discloses a planar linear inductive position sensor that is formed on a substrate and includes at least one oscillating coil, a first sensing coil having opposing edges extending beyond opposing edges of the oscillating coil along a linear axis along which a linear position of a conductive target is to be sensed, and a second sensing coil having opposing edges extending beyond opposing edges of the oscillating coil along the linear axis. The first and second sensing coils have geometries selected such that equal opposing magnetic fields are induced in the first and second sensing coils in the presence of a magnetic field generated by the oscillating coil when no conductive target is proximate to the first and second sensing coils and unequal opposing magnetic fields are induced in the first and second sensing coils when the conductive target is proximate to the first and second sensing coils, a difference in the unequal opposing magnetic fields induced in the first and second sensing coils correlated to the position of the conductive target.

SUMMARY

This Summary is provided to introduce a selection of concepts that are further described below in the Detailed Description. This Summary is not intended to identify key or essential features of the claimed subject matter, nor is it intended to be used as an aid in limiting the scope of the claimed subject matter.

According to one example of the present disclosure, an electric linear actuator comprises a housing extending along a longitudinal axis. A spindle is provided in the housing and extends along the longitudinal axis. A rod is coaxially coupled to the spindle and extends from a proximal end located in the housing to a distal end located outside the housing. The rod is movable along the longitudinal axis in response to rotation of the spindle. A circuit board is located in the housing adjacent the proximal end of the rod. The circuit board comprises a linear inductive sensor having a linear axis oriented parallel to the longitudinal axis. The linear inductive sensor is configured to sense an actual position of the proximal end of the rod.

According to one example, the electric linear actuator further comprises a motor configured to rotate the spindle and a controller configured to control the motor. In one example, the controller is configured to control the motor based on the actual position of the proximal end of the rod.

According to one example, the controller is configured to determine a calculated position of the proximal end of the rod based on at least one of an activation time of the motor, a current provided to the motor, and a voltage provided to the motor.

According to one example, the controller is configured to input the calculated position and the actual position into a digital filter so as to determine an estimated position of the proximal end of the rod. In one example, the controller is configured to use pulse-width modulation to activate the motor to rotate the spindle, and the controller uses the estimated position to determine a duty cycle of the pulse-width modulation. In another example, the controller is configured to supply the motor with a given voltage for a predetermined period of time to rotate the spindle, and the controller uses the estimated position to determine the predetermined period of time.

According to one example, the linear inductive sensor is configured to sense the actual position of the proximal end of the rod over a full extent of travel of the proximal end of the rod.

According to another example of the present disclosure, an electric linear actuator comprises a housing extending along a longitudinal axis. A spindle is provided in the housing and extends along the longitudinal axis. A rod is coaxially coupled to the spindle and extends from a proximal end located in the housing to a distal end located outside the housing. The rod is movable along the longitudinal axis in response to rotation of the spindle. A linear inductive sensor is coupled to the housing and has a linear axis oriented parallel to the longitudinal axis. A motor is configured to rotate the spindle. A controller is configured to control the motor. The linear inductive sensor is configured to sense an actual position of the proximal end of the rod. The controller is configured to control the motor based on the actual position.

According to one example, the controller is configured to determine a calculated position of the proximal end of the rod based on at least one of an activation time of the motor, a current provided to the motor, and a voltage provided to the motor.

According to one example, the controller is configured to input the calculated position and the actual position into a digital filter so as to determine an estimated position of the proximal end of the rod. In one example, the controller is configured to use pulse-width modulation to activate the motor to rotate the spindle, and the controller uses the estimated position to determine a duty cycle of the pulse-width modulation. In another example, the controller is configured to supply the motor with a given voltage for a predetermined period of time to rotate the spindle, and the controller uses the estimated position to determine the predetermined period of time.

According to another example of the present disclosure, a method for an electric linear actuator comprises sensing an actual position of a proximal end of a rod coaxially coupled to a spindle and being movable along a longitudinal axis in response to rotation of the spindle. The method comprises, with a processor, determining a calculated position of the proximal end of the rod based on at least one of an activation time of a motor configured to rotate the spindle, a current provided to the motor, and a voltage provided to the motor. The method comprises, with the processor, inputting the calculated position and the actual position into a digital filter so as to determine an estimated position of the proximal end of the rod. The method comprises using the estimated position to control the motor.

According to one example, the method comprises using the estimated position to determine a duty cycle of pulse-width modulation for activating the motor to rotate the spindle.

According to one example, the method comprises using the estimated position to determine a predetermined period of time for supplying the motor with a given voltage to rotate the spindle.

According to one example, sensing the actual position of the proximal end of the rod comprises using a linear inductive sensor having a linear axis oriented parallel to the longitudinal axis.

BRIEF DESCRIPTION OF THE DRAWINGS

Examples of electric linear actuators and algorithms and methods therefor are described with reference to the following Figures. The same numbers are used throughout the Figures to reference like features and like components.

FIG. 4 illustrates one example of the electric linear actuator according to FIG. 1.

DETAILED DESCRIPTION

Figure 1:
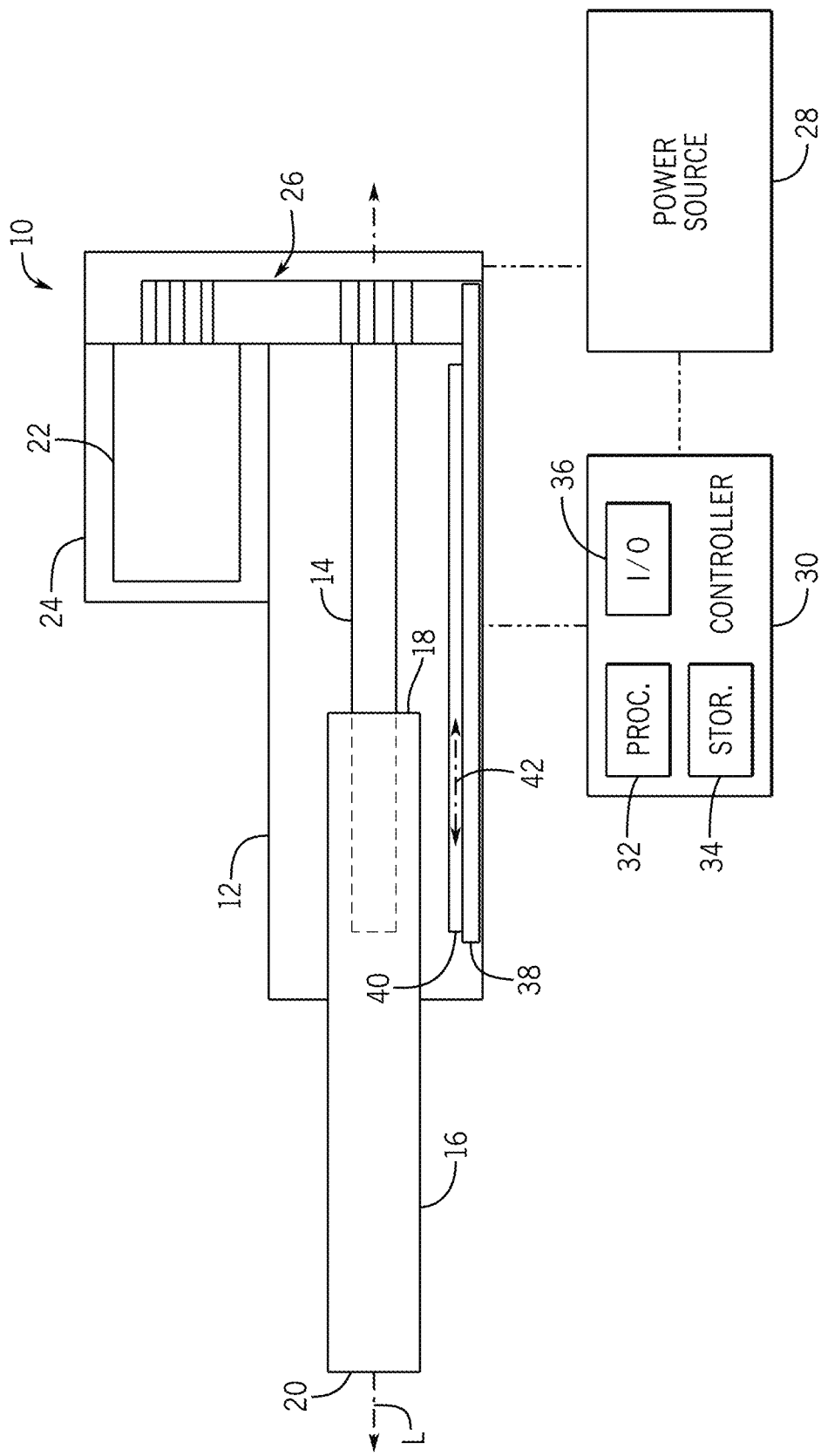
FIG. 1 is a schematic representation of an electric linear actuator with a position sensor integrated therein.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items.

Unless otherwise specified or limited, the phrases "at least one of A, B, and C," "one or more of A, B, and C," and the like, are meant to indicate A, or B, or C, or any combination of A, B, and/or C, including combinations with multiple instances of A, B, and/or C. Likewise, unless otherwise specified or limited, the terms "mounted," "connected," "linked," "supported," and "coupled" and variations thereof are used broadly and encompass both direct and indirect mountings, connections, supports, and couplings. Further, unless otherwise specified or limited, "connected" and "coupled" are not restricted to physical or mechanical connections or couplings.

As used herein, unless otherwise limited or defined, discussion of particular directions is provided by example only, with regard to particular embodiments or relevant illustrations. For example, discussion of "top," "bottom," "front," "back," "left," "right," "lateral" or "longitudinal" features is generally intended as a description only of the orientation of such features relative to a reference frame of a particular example or illustration. Correspondingly, for example, a "top" feature may sometimes be disposed below a "bottom" feature (and so on), in some arrangements or embodiments. Additionally, use of the words "first," "second", "third," etc. is not intended to connote priority or importance, but merely to distinguish one of several similar elements from another.

Electric linear actuators are used for various purposes and across various industries. Generally, an electric linear actuator has a housing (also referred to as a cover tube), a spindle (also referred to as a lead screw), and a rod (also referred to as an extension tube or piston rod) movable along the spindle so as to extend the rod from the housing and retract the rod into the housing. This facilitates movement of a component attached to the distal end of the rod with respect to a component to which the housing is attached. Movement of the spindle is accomplished with an electric motor, which can have its output shaft aligned parallel and laterally adjacent to the longitudinal axis of the housing, parallel and longitudinally in-line with the longitudinal axis of the housing, or perpendicular to the longitudinal axis of the housing. A gear train typically couples the motor's output shaft to the input shaft of the spindle. A mechanism such as a ball nut, roller screw, or an acme nut couples the rod to the spindle and converts rotation of the spindle to movement of the rod along the longitudinal axis. Various other components can be included in the electric linear actuator, such as, but not limited to, a clutch, a brake, wipers/seals, limit switches, etc. as is known in the art.

Typically, the amount by which the rod is extended from the housing is determined via calculation by a controller. For example, given a known starting position of the rod with respect to the housing (e.g., fully retracted) the controller can map a current provided to the motor and a length of time the current was provided to the motor, a voltage provided to the motor and a length of time the voltage was provided to the motor, or both the current and voltage and length of time the current and voltage are provided to the motor, to a calculated position of the rod. For example, the calculated position is determined from a look-up map that accepts current and/or voltage and time as inputs. The map includes calibrated values of how far along the spindle the rod is expected to travel in response to the motor being supplied with a given current and/or voltage for a given length of time. For example, the map relates a given current to a rate of movement of the rod per unit time, which can be multiplied by the time for which the current was provided to determine how far the rod traveled. The controller adds or subtracts this incremental value from the known starting position to obtain a calculated position of the rod.

FIG. 1 illustrates one example of an electric linear actuator 10 according to the present disclosure. The electric linear actuator 10 includes a housing 12 extending along a longitudinal axis L. A spindle 14 is provided in the housing 12 and extends along the longitudinal axis L. A rod 16 is coaxially coupled to the spindle 14, such as by way of the above-mentioned ball nut, roller screw, or acme nut (not shown). The rod 16 extends from a proximal end 18 located in the housing 12 to a distal end 20 located outside the housing 12. The rod 16 is movable along the longitudinal axis L in response to rotation of the spindle 14, due to the coupling between the rod 16 and the spindle 14 provided by the ball nut, roller screw, or acme nut.

A motor 22 is configured to rotate the spindle 14. The motor 22 is located in a motor housing 24 adjacent the housing 12. The output shaft of the motor 22 is coupled to the input shaft of the spindle 14 by way of a gear train 26. The motor 22 is provided with power from a power source 28, such as a battery. A controller 30 is configured to control the motor 22, such as by controlling the power provided to the motor 22 from the power source 28. In one example, the controller 30 controls the power to the motor 22 using pulse-width modulation. Note that although the controller 30 and power source 28 are shown as being connected to the housing 12 of the electric linear actuator 10, they are in fact connected to the electrical components inside the housings 12 and 24, and not every signal or power connection is shown herein.

The controller 30 includes a processing system 32, a storage system 34 accessible by the processing system 32, and an input/output (I/O) interface 36, which relays information to and from the processing system 32. The processing system 32 can comprise a microprocessor, including a control unit and a processing unit, and other circuitry, such as semiconductor hardware logic, that retrieves and executes software from the storage system 34. The storage system 34 can comprise any storage media readable by the processing system 32 and capable of storing software. The storage system 34 can include volatile and non-volatile, removable and non-removable media implemented in any method or technology for storage of information, such as computer-readable instructions, data structures, software modules, or other data. The processing system 32 loads and executes software from the storage system 34, such as software programmed with a rod positioning algorithm, which directs the processing system 32 to operate as described herein below in further detail. Note that the controller 30 is not shown as being connected to every component in the diagram provided herein, but the controller 30 is in fact directly or indirectly electrically and/or signally connected to each component that it is described as controlling or from which it receives information.

The electric linear actuator 10 also includes a circuit board 38 located in the housing 12 adjacent the proximal end 18 of the rod 16. In this instance, the circuit board extends along a majority of the length of the housing 12. The circuit board 38 comprises a linear inductive sensor 40 having a linear axis 42 oriented parallel to the longitudinal axis L of the housing 12. The linear inductive sensor 40 is configured to sense an actual position of the proximal end 18 of the rod 16. The length of the linear inductive sensor 40 is such that the linear inductive sensor 40 is configured to sense the actual position of the proximal end 18 of the rod 16 over a full extent of travel of the proximal end 18 of the rod 16. In other words, the linear inductive sensor 40 is long enough to sense the proximal end 18 of the rod 16 when it is fully retracted inside the housing 12 as well as when the rod 16 is fully extended from the housing 12.

The linear inductive sensor 40 is coupled to the power source 28 and includes a transmission coil that generates a magnetic field when power is provided thereto. The magnetic field induces eddy currents in the rod 16, which is made of a conductive metal. The presence of the metallic rod 16 changes the magnetic field, and receiver coils in the linear inductive sensor 40 sense this change in the magnetic field. The linear inductive sensor 40 is planar, i.e., the transmission and receiver coils are formed on the circuit board 38 using conventional printed circuit board fabrication techniques. A microcontroller on the circuit board 38 and coupled to the coils calculates the position of the proximal end 18 of the rod 16 based on the sensed change in the magnetic field. Thus, the linear inductive sensor 40 is able to determine the proximal end 18 of the rod 16 due to the different magnetic field the rod 16 generates as compared to the magnetic field generated by the spindle 14. One example of a linear inductive sensor for such application is the LX3302A provided by Microchip Technology Inc. of Chandler, Arizona. Another example is that described in U.S. Pat. No. 10,760,928, incorporated by reference herein.

The microcontroller of the linear inductive sensor 40 is in signal communication with the controller 30. Either the microcontroller of the linear inductive sensor 40 or the controller 30 can be configured such that the information regarding the change magnetic field is related to a position of the proximal end 18 of the rod 16 with respect to its fully extended or fully retracted position, which the controller 30 may consider to be the actual position of the proximal end 18 of the rod 16. For example, a given change in the magnetic field detected by the receiver coils can be related to a percentage to which the rod 16 is extended with respect to its fully extended position. In one example, the controller 30 can be calibrated using values that the receiver coils of the linear inductive sensor detect when the rod 16 is fully retracted and when the rod 16 is fully extended, and a lookup table, map, or equation can be created and stored in the storage system 34 that relates any intermediate values to a percentage of the fully extended or fully retracted position of the rod.

In some embodiments, the controller 30 is configured to control the motor 22 based on the actual position of the proximal end 18 of the rod 16. For example, the controller 30 can be programmed to move the rod 16 to another position by activating the motor 22 with a given voltage and/or current for a given time in order to move the rod from a present actual position to a setpoint position. Knowing the actual starting point of the rod 16 can enable the controller 30 to position the rod 16 more accurately than if the position of the rod 16 is only a calculated value based on the prior provided voltage and/or current and time for which that voltage and/or current was provided, which method typically results in accumulated error.

Figure 2:
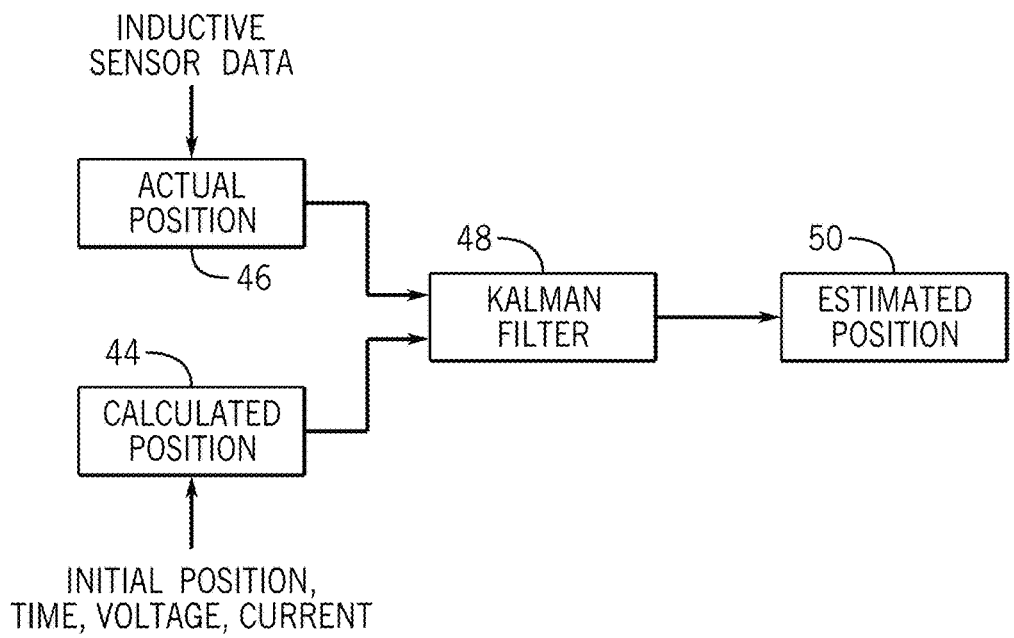
FIG. 2 is a schematic showing an algorithm for determining an estimated position of a rod of the electric linear actuator.

There may be instances in which the actual position of the proximal end 18 of the rod 16 as determined by the linear inductive sensor 40 is also inaccurate. Thus the controller 30 may be configured to use multiple sources of information to determine an estimated position of the rod 16. For example, referring to FIG. 2, the controller 30 may be configured to determine a calculated position of the proximal end 18 of the rod 16 based on at least one of an activation time of the motor 22, a current provided to the motor 22, and a voltage provided to the motor 22, given on a calibration of how far the rod 16 would move from an initial position under those conditions. This calculated position is shown at 44. Further, as noted above, the controller 30 can determine the actual position of the proximal end 18 of the rod 16 based on data from the linear inductive sensor 40, as shown at 46. The controller 30 is configured to input the calculated position 44 and the actual position 46 into a digital filter 48 so as to determine an estimated position 50 of the proximal end 18 of the rod 16. In one example, the digital filter is a Kalman filter, as shown in FIG. 2. The Kalman filter accepts both the calculated position 44 and the actual position 46 as two sources of position measurements to be used in the update phase of the algorithm. While the actual position 46 can be determined periodically and/or on demand, the calculated position 44 might only be updated each time the rod 16 moves. The calculated position 44 can therefore be used in the update phase of the algorithm only as new values become available. Other types of digital filters could be used, such as a dynamic data reconciliation filter or an alpha beta filter.

In another example, only a series of actual position measurements from the linear inductive sensor 40 are passed through the Kalman filter 48 to determine the estimated position 50.

Having a more accurate estimate of the position of the proximal end 18 of the rod 16 enables the controller 30 in turn to position the rod 16 more accurately. For example, near real-time position feedback from multiple sources enables the controller 30 to more accurately position the rod 16 to a setpoint position. The controller 30 can compare the estimated position 50 to the setpoint position to determine if the setpoint position has been reached, and if not, how much further the rod 16 needs to travel to reach the setpoint.

In one example, the controller 30 is configured to use pulse-width modulation (PWM) to activate the motor 22 to rotate the spindle 14. The controller 30 uses the estimated position 50 to determine a duty cycle of the pulse-width modulation. For example, in response to determining that the estimated position of the proximal end 18 of the rod 16 is within a predetermined threshold of the setpoint position, the controller 30 can reduce the duty cycle accordingly such that that rod 16 stops more accurately at the setpoint position without overshoot. In some instances, the controller 30 may ramp down the duty cycle in response to determining that the estimated position of the proximal end 18 of the rod 16 is within a predetermined threshold of the setpoint position until the rod 16 reaches the setpoint position.

In another example, the controller 30 is configured to supply the motor 22 with a given voltage for a predetermined period of time to rotate the spindle 14. The controller 30 uses the estimated position 50 to determine the predetermined period of time for which to supply the motor 22 with the given voltage. This differs from the PWM method of positioning the rod 16 in that the controller 30 supplies maximum voltage (or near maximum voltage) from the power source 28 for the predetermined period of time, as opposed to pulse-width modulating the voltage to achieve an average voltage that is less than the maximum. Using the latter method might allow the motor 22 to overcome a load on the electric linear actuator 10 that a pulse-width modulated voltage might not otherwise be able to overcome. However, similar to the PWM method, the controller 30 may provide such a "micro-burst" of full voltage in response to determining that the estimated position of the proximal end 18 of the rod 16 is within a predetermined threshold of the setpoint position. The controller 30 may commence by providing longer microbursts of full voltage, and ramp down to providing shorter and shorter microbursts as the rod 16 approaches the setpoint position.

In either case noted above, the controller 30 uses a difference between the setpoint position and the estimated position 50 to look up or calculate the duty cycle or the predetermined period of time, as the case may be. In this manner, the controller 30 uses the estimated position 50 to determine a duty cycle of the pulse-width modulation or the predetermined period of time.

Figure 3:
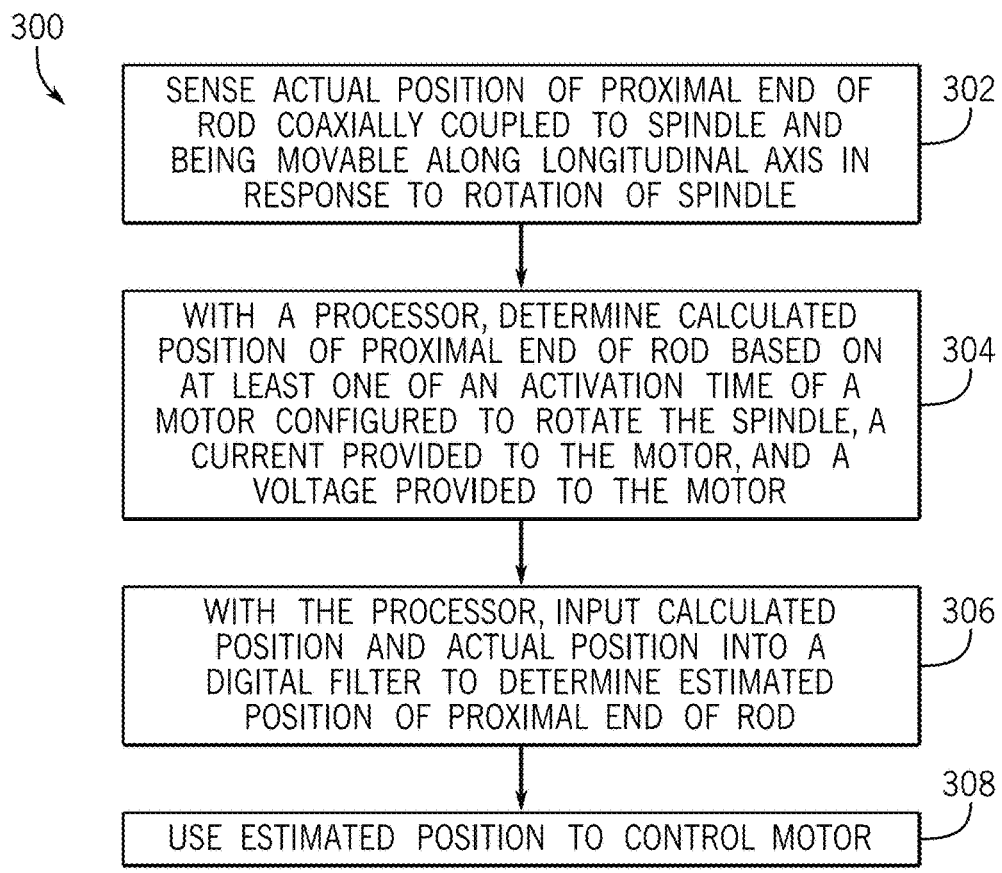
FIG. 3 illustrates a method for an electric linear actuator.

FIG. 3 illustrates one example of a method 300 for an electric linear actuator 10 according to the present disclosure. As shown at 302, the method includes sensing an actual position of a proximal end 18 of a rod 16 coaxially coupled to a spindle 14 and being movable along a longitudinal axis L in response to rotation of the spindle 14. In one example, as noted hereinabove, sensing the actual position of the proximal end 18 of the rod 16 comprises using a linear inductive sensor 40 having a linear axis 42 oriented parallel to the longitudinal axis L. As shown at 304, the method also includes, with a processor 32, determining a calculated position of the proximal end 18 of the rod 16 based on at least one of an activation time of a motor 22 configured to rotate the spindle 14, a current provided to the motor 22, and a voltage provided to the motor 22. As shown at 306, the method also includes, with the processor 32, inputting the calculated position and the actual position into a digital filter (e.g., a Kalman filter 48) so as to determine an estimated position of the proximal end 18 of the rod 16. As shown at 308, the method includes using the estimated position to control the motor 22. In one example, the method includes using the estimated position to determine a duty cycle of pulse-width modulation for activating the motor 22 to rotate the spindle 14. In another example, the method includes using the estimated position to determine a predetermined period of time for supplying the motor 22 with a given voltage to rotate the spindle 14.

According to another example of the present disclosure, an electric linear actuator 10 comprises a housing 12 extending along a longitudinal axis L. A spindle 14 is provided in the housing 12 and extends along the longitudinal axis L. A rod 16 is coaxially coupled to the spindle 14 and extends from a proximal end 18 located in the housing 12 to a distal end 20 located outside the housing 12. The rod 16 is movable along the longitudinal axis L in response to rotation of the spindle 14. A linear inductive sensor 40 is coupled to the housing 12 and has a linear axis 42 oriented parallel to the longitudinal axis L. A motor 22 is configured to rotate the spindle 14. A controller 30 is configured to control the motor 22. The linear inductive sensor 40 is configured to sense an actual position 46 of the proximal end 18 of the rod 16. The controller 30 is configured to control the motor 22 based on the actual position 46.

The controller 30 is configured to determine a calculated position 44 of the proximal end 18 of the rod 16 based on at least one of an activation time of the motor 22, a current provided to the motor 22, and a voltage provided to the motor 22. The controller 30 is configured to input the calculated position 44 and the actual position 46 into a digital filter (e.g., a Kalman filter 48) so as to determine an estimated position 50 of the proximal end 18 of the rod 16. In one example, the controller 30 is configured to use pulse-width modulation to activate the motor 22 to rotate the spindle 14, and the controller 30 uses the estimated position 50 to determine a duty cycle of the pulse-width modulation. In another example, the controller 30 is configured to supply the motor 22 with a given voltage for a predetermined period of time to rotate the spindle 14, and the controller 30 uses the estimated position 50 to determine the predetermined period of time.

FIG. 4 shows an example of an electric linear actuator 110 according to the present disclosure. In this example, the electric linear actuator 110 is a trim tab actuator configured to be coupled to a trim tab on a marine vessel. That is, the distal end 120 of the rod 116 is configured to be coupled to the trim tab, while the housing 112 is configured to be coupled to the hull of the marine vessel. In other examples, the electric linear actuator 110 could be used to raise and lower a swim platform, to actuate a hatch, or to actuate some other component on a marine vessel or a recreational vehicle.

The linear inductive sensor 140 is shown on the circuit board 138, which is inserted directly inside the housing 112, such as in a channel built into the inner side of the housing 12. It can be seen that the circuit board 138 and linear inductive sensor 140 are directly adjacent, but not touching, the rod 116 so that the coils in the linear inductive sensor 140 are close enough to generate and detect the magnetic fields in the rod 116. In one example, the linear inductive sensor 140 is about 1.5 mm from the outer surface of the rod 116. Although the motor is not shown in this example, it is coupled to the spindle and thus to the rod 116 by the gear train 126.

The above-noted electric linear actuators 10, 110 with integrated linear inductive sensors 40, 140 have various advantages over the prior art. The measurement of the actual position of the rod 16, 116 does not include the inaccuracy inherent in measuring a component that is one, two, or more components removed from the rod 16, 116, nor from the inaccuracy that typically results from backlash between the rod and the spindle. Further, no magnet is required to be installed on the rod 16, 116 or elsewhere for measurement purposes. The linear inductive sensor 40, 140 can sense the proximal end of the rod 16, 116 simply because it is made of conductive metal.

In the present description, certain terms have been used for brevity, clarity, and understanding. No unnecessary limitations are to be implied therefrom beyond the requirement of the prior art because such terms are used for descriptive purposes only and are intended to be broadly construed. The different systems described herein may be used alone or in combination with other systems. Various equivalents, alternatives, and modifications are possible within the scope of the appended claims.

What is claimed is:

1. An electric linear actuator comprising:
   a housing extending along a longitudinal axis;
   a spindle provided in the housing and extending along the longitudinal axis;
   a rod, made of a conductive metal, coaxially coupled to the spindle and extending from a proximal end located in the housing to a distal end located outside the housing, the rod being movable along the longitudinal axis in response to rotation of the spindle;
   a circuit board located in the housing adjacent the proximal end of the rod, the circuit board comprising a linear inductive sensor having a linear axis oriented parallel to the longitudinal axis; and
   a controller in communication with the linear inductive sensor;
   wherein the linear inductive sensor is configured to generate a magnetic field and to sense an actual position of the proximal end of the rod based on a sensed change in the magnetic field due to a presence of the rod;
   wherein the controller is calibrated using sensed values that the linear inductive sensor detects when the rod is in a fully retracted position with respect to the housing and when the rod is in a fully extended position with respect to the housing, and the controller is configured to store a relationship between the sensed values and a relative position of the proximal end of the rod with respect to the fully retracted position or the fully extended position; and
   wherein the controller is configured to determine the actual position of the proximal end of the rod based on the stored relationship between the sensed values and the relative position of the proximal end of the rod with respect to the fully retracted position or the fully extended position.

2. The electric linear actuator of claim 1, further comprising:
   a motor configured to rotate the spindle;
   wherein the controller is configured to control the motor.

3. The electric linear actuator of claim 2, wherein the controller is configured to control the motor based on the actual position of the proximal end of the rod.

4. The electric linear actuator of claim 2, wherein the controller is configured to determine a calculated position of the proximal end of the rod based on at least one of an activation time of the motor, a current provided to the motor, and a voltage provided to the motor.

5. The electric linear actuator of claim 4, wherein the controller is configured to input the calculated position and the actual position into a digital filter so as to determine an estimated position of the proximal end of the rod.

6. The electric linear actuator of claim 5, wherein the digital filter is a Kalman filter.

7. The electric linear actuator of claim 5, wherein the controller is configured to use pulse-width modulation to activate the motor to rotate the spindle, and wherein the controller uses the estimated position to determine a duty cycle of the pulse-width modulation.

8. The electric linear actuator of claim 5, wherein the controller is configured to supply the motor with a given voltage for a predetermined period of time to rotate the spindle, and wherein the controller uses the estimated position to determine the predetermined period of time.

9. The electric linear actuator of claim 1, wherein the linear inductive sensor is configured to sense the actual position of the proximal end of the rod over a full extent of travel of the proximal end of the rod.

10. The electric linear actuator of claim 1, wherein the electric linear actuator is a trim tab actuator configured to be coupled to a trim tab on a marine vessel.

11. An electric linear actuator comprising:
    a housing extending along a longitudinal axis;
    a spindle provided in the housing and extending along the longitudinal axis;
    a rod, made of a conductive metal, coaxially coupled to the spindle and extending from a proximal end located in the housing to a distal end located outside the housing, the rod being movable along the longitudinal axis in response to rotation of the spindle;
    a linear inductive sensor coupled to the housing and having a linear axis oriented parallel to the longitudinal axis;
    a motor configured to rotate the spindle; and
    a controller configured to control the motor;
    wherein the linear inductive sensor is configured to generate a magnetic field and to sense an actual position of the proximal end of the rod based on a sensed change in the magnetic field due to a presence of the rod;
    wherein the controller is configured to control the motor based on the actual position of the proximal end of the rod;
    wherein the controller is calibrated using sensed values that the linear inductive sensor detects when the rod is in a fully retracted position with respect to the housing and when the rod is in a fully extended position with respect to the housing, and the controller is configured to store a relationship between the sensed values and a relative position of the proximal end of the rod with respect to the fully retracted position or the fully extended position; and
    wherein the controller is configured to determine the actual position of the proximal end of the rod based on the stored relationship between the sensed values and the relative position of the proximal end of the rod with respect to the fully retracted position or the fully extended position.

12. The electric linear actuator of claim 11, wherein the controller is configured to determine a calculated position of the proximal end of the rod based on at least one of an activation time of the motor, a current provided to the motor, and a voltage provided to the motor.

13. The electric linear actuator of claim 12, wherein the controller is configured to input the calculated position and the actual position into a digital filter so as to determine an estimated position of the proximal end of the rod.

14. The electric linear actuator of claim 13, wherein the controller is configured to use pulse-width modulation to activate the motor to rotate the spindle, and wherein the controller uses the estimated position to determine a duty cycle of the pulse-width modulation.

15. The electric linear actuator of claim 13, wherein the controller is configured to supply the motor with a given voltage for a predetermined period of time to rotate the spindle, and wherein the controller uses the estimated position to determine the predetermined period of time.

* * * * *